United States Patent
Bungo et al.

(10) Patent No.: US 10,837,718 B2
(45) Date of Patent: Nov. 17, 2020

(54) LAMINATED CORE TYPE HEAT SINK

(71) Applicant: T.RAD CO., LTD., Tokyo (JP)

(72) Inventors: Takuya Bungo, Tokyo (JP); Atsushi Okubo, Tokyo (JP); Taiji Sakai, Tokyo (JP)

(73) Assignee: T.RAD Co., Ltd., Tokyo (JP)

( * ) Notice: Subject to any disclaimer, the term of this patent is extended or adjusted under 35 U.S.C. 154(b) by 0 days.

(21) Appl. No.: 15/754,523

(22) PCT Filed: Sep. 14, 2016

(86) PCT No.: PCT/JP2016/078131
§ 371 (c)(1),
(2) Date: Feb. 22, 2018

(87) PCT Pub. No.: WO2017/047824
PCT Pub. Date: Mar. 23, 2017

(65) Prior Publication Data
US 2018/0283802 A1    Oct. 4, 2018

(30) Foreign Application Priority Data
Sep. 18, 2015  (JP) .................. 2015-184707

(51) Int. Cl.
| H05K 7/20 | (2006.01) |
| F28F 3/04 | (2006.01) |
| F28F 3/08 | (2006.01) |
| H01L 23/473 | (2006.01) |
| F28D 1/03 | (2006.01) |
| F28F 9/00 | (2006.01) |

(52) U.S. Cl.
CPC ............ *F28F 3/048* (2013.01); *F28D 1/0308* (2013.01); *F28F 3/08* (2013.01); *F28F 9/001* (2013.01); *H01L 23/473* (2013.01); *H05K 7/20* (2013.01); *H05K 7/20254* (2013.01); *H05K 7/20409* (2013.01)

(58) Field of Classification Search
CPC ......... F28F 3/08; H05K 7/20254; H05K 7/20; H05K 7/20409; F28D 1/0308; H01L 23/473
USPC ................................ 165/80.4, 168; 361/699
See application file for complete search history.

(56) References Cited

U.S. PATENT DOCUMENTS

| 7,247,030 B2 * | 7/2007 | Hilty .................... H01R 9/2658 439/607.05 |
| 10,655,922 B2 * | 5/2020 | Bungo ............... H05K 7/20927 |
| 10,739,085 B2 * | 8/2020 | Bungo ............... H05K 7/20254 |
| 2003/0152488 A1 * | 8/2003 | Tonkovich ............ B01F 5/0614 422/400 |

(Continued)

FOREIGN PATENT DOCUMENTS

| DE | 10 2012 106244 A1 | 5/2014 |
| DE | 10 2013 109246 A1 | 3/2015 |

(Continued)

*Primary Examiner* — Ljiljana V. Ciric
(74) *Attorney, Agent, or Firm* — Norris McLaughlin, P.A.

(57) ABSTRACT

In a laminated core type heat sink in which a plate is formed by arranging a plurality of slits in parallel to a metal flat plate and by laminating the plate in large numbers, the thickness of a second plate positioned second in the lamination direction from an end lid to which a semiconductor is attached is made greater than thickness of a first plate other than the second plate.

9 Claims, 8 Drawing Sheets

(56) References Cited

U.S. PATENT DOCUMENTS

| | | | |
|---|---|---|---|
| 2005/0133212 A1* | 6/2005 | Wilson | F28F 3/086 165/168 |
| 2005/0189342 A1* | 9/2005 | Kabbani | F28F 3/086 219/494 |
| 2007/0163765 A1* | 7/2007 | Rondier | H05K 7/20927 165/170 |
| 2007/0246204 A1* | 10/2007 | Lai | F28F 3/086 165/166 |
| 2014/0231055 A1* | 8/2014 | Schalansky | F28F 9/001 165/166 |
| 2016/0129792 A1* | 5/2016 | Gohara | B23P 15/26 310/54 |
| 2018/0245862 A1* | 8/2018 | Bungo | F28F 13/003 |
| 2018/0283802 A1* | 10/2018 | Bungo | H05K 7/20 |
| 2019/0249934 A1* | 8/2019 | Bungo | H05K 7/20 |

FOREIGN PATENT DOCUMENTS

| | | |
|---|---|---|
| JP | 10-308486 A | 11/1998 |
| JP | 2007-242724 A | 9/2007 |
| JP | 2008-171840 A | 7/2008 |
| JP | 2010-114174 A | 5/2010 |
| JP | 2012-055895 A | 3/2012 |
| JP | 2013-030713 A | 2/2013 |
| JP | 2013-235967 A | 11/2013 |
| JP | 2014-033063 A | 2/2014 |

\* cited by examiner

LAMINATED CORE TYPE HEAT SINK

BACKGROUND OF THE INVENTION

The present invention relates to a device that is a laminated core type heat sink having a core obtained by laminating a plurality of plates, each plate being a metal flat plate with a plurality of punched out slits and a rib formed in a portion other than the slits, with end lids arranged and joined to both upper and lower ends thereof, and an element of any of various circuit boards such as an inverter is arranged to the end lid to as an object to be cooled by circulating a refrigerant in a meandering way into a flow path formed by slits of each plate.

The present applicant has already proposed a laminated type heat sink described in Japanese Patent Laid-Open No. 2014-33063.

In the heat sink, as shown in FIG. 11, slits 1 in parallel to each other are punched out for each metal flat plate, and, between these, a plurality of long and thin longitudinal ribs 2 in parallel to each other and transverse ribs 3 orthogonal to these are formed. Then, plates 4 adjacent mutually are laminated so that the longitudinal ribs 2 overlap with each other and the transverse ribs 3 are situated so as not to overlap in a circulation direction of a refrigerant 7, to thereby form a core. Then, the refrigerant 7 circulates in a meandering way escaping from each transverse rib 3 of adjacent plates. In this laminated type heat sink, each of the plates has identical thickness.

SUMMARY OF THE INVENTION

In order to further improve a heat release performance, the present inventor made the flow state of a refrigerant visible, and checked temperature distribution of respective parts which changed in accordance with the increase in distance from the surface of respective parts of plate.

FIG. 6 illustrates a flow state in a conventional laminated type heat sink. In the drawing, it was known that, in a plate 4 that contacted to an end lid 9 and most contributed to heat exchange, a swirling current was generated on a downstream side of the transverse rib 3 thereof. Furthermore, at this time as shown in FIG. 8, it was known that, when temperature distribution near the transverse rib 3 was measured on a downstream side of the plate 4, the temperature distribution was high in a backwater region where the swirling current was generated with respect to the transverse rib 3.

In the experiment, water was utilized as a refrigerant, temperature and flow rate of the water at an inflow port were set, respectively, to 65° C. and 10 L/min, a semiconductor element was attached on the end lid 9 as an object to be cooled, heat generation of 300 W was performed, and temperature distribution near the surface of the plate 4 contacting to the end lid 9 was checked to know that distribution in FIG. 8 was generated.

That is, FIG. 8 illustrates a range having temperature difference of not less than 72.25° C. in cross-section part of the water shown dotted (not less than 74° C.) and in cross-section part of the water shown cross-hatched (72.25° C. to 74° C.). The position where the flow stagnated and a swirling current was present in FIG. 6 showed distribution with high water temperature and large thickness of the range of not less than 72.25° C.

That is, in FIG. 8, the part shown by dots near the surface of the plate 4 is at not less than 74° C., and the range of the part shown cross-hatched is at 72.25° C. to 74° C.

As is clear from the drawing, it was known that a distribution range at relatively high temperatures was broad on a downstream side of the plate 4.

Consequently, the present invention aims at eliminating a stagnant region 10 on the downstream side of the transverse rib 3 arranged first from the end lid 9 and thinning as far as possible a temperature distribution region at high temperatures generated therein to accelerate heat exchange as a whole.

A first aspect of the present invention is a laminated core type heat sink, in which:

a plurality of flat plates is included, each flat plate being a metal flat plate having a plurality of slits (1) punched out in parallel to each other, and a plurality of long and thin longitudinal ribs (2) in parallel to each other and transverse ribs (3) linking respective adjacent longitudinal ribs (2), formed between the slits (1);

a core is included in which respective plates (4) are laminated while the longitudinal rib (2) is matched mutually and a position of the transverse rib (3) is shifted mutually, an end lid (9) is arranged to both ends in a lamination direction, and each of plates (4) is joined; and a refrigerant is circulated into each of the slits (1) of the core in a longitudinal rib (2) direction, and an object (6) to be cooled is joined to an outer surface of the end lid (9), wherein a plurality of first plates (4a) that has identical thickness and is adjacent to each other in a lamination direction, and a second plate (4b) that is arranged on the second in the lamination direction from the end lid (9) and is thicker than the first plate (4a) are included as the core.

A second aspect of the present invention is the laminated core type heat sink according to claim 1, wherein (thickness T2 of second plate (4b))/(thickness T1 of first plate (4a))≥1.2 is satisfied.

A third aspect of the present invention is the laminated core type heat sink according to the first aspect, wherein the plurality of first plates (4a) having an identical planar shape is piled up to form the second plate (4b).

A fourth aspect of the present invention is the laminated core type heat sink according to any of the first to third aspects, wherein:

each of the plates includes a pair of manifold parts (5) positioned at both ends in a long side direction of the longitudinal rib (2) in the core and a frame part (13) surrounding the core and the manifold part (5); and These are formed integrally with the core.

A fifth aspect of the present invention is a laminated core type heat sink, comprising:

a plurality of flat plates (4), the flat plate being a metal flat plate having a plurality of slits (1) punched out in parallel to each other, and a plurality of long and thin longitudinal ribs (2) in parallel to each other and transverse ribs (3) linking respective adjacent longitudinal ribs (2) formed between the slits (1), laminated so that the longitudinal ribs (2) are matched with each other and positions of the transverse ribs (3) are shifted from each other; and a core in which respective plates (4) are joined and a casing (11) in a dish-like shape at least on one side in an inside of which the core is housed so that a pair of manifold parts (5) are formed at both ends in a long side direction of the longitudinal rib (2), in which a refrigerant is circulated in a longitudinal rib (2) direction into the each slit (1) of the core via the manifold part (5) and an object (6) to be cooled is joined to an outer surface of the casing (11), wherein the core has a plurality of first plates (4a) that have identical thickness and is adjacent in a lamination direction to each other and a second plate (4b) that is arranged on a second in the lamination direction from the casing (11) and has greater thickness than the first plate (4a).

The sixth aspect of the present invention is the laminated core type heat sink according to the fifth aspect, wherein (thickness T2 of second plate (4b))/(thickness T1 of first plate (4a))≥1.2 is satisfied.

The seventh aspect of the present invention is the laminated core type heat sink according to the fifth aspect, wherein the plurality of first plates (4a) having an identical planar shape is piled up to form the second plate (4b).

The laminated core type heat sink of the present invention is characterized in that the core thereof has a plurality of first plate 4a that is adjacent in an lamination direction to each other and has identical thickness, and that the thickness of a second plate 4b positioned on the second in the lamination direction from the end lid 9 has greater thickness than the first plate 4a.

Consequently, flow of a refrigerant around the first plate 4a contacting to the end lid 9 having an object 6 to be cooled is improved (from a conventional state in FIG. 6, changes into the state of the present invention in FIG. 5), and, as the distance from the surface increases, temperature distribution of a refrigerant rapidly decreases (from a conventional state in FIG. 8, changes into the state of the present invention in FIG. 7) to improve heat exchange performance.

In the laminated core type heat sink of the second aspect, when (thickness T2 of second plate 4b)/(thickness T1 of first plate 4a)≥1.2 is satisfied, heat exchange performance can surly be improved.

In the laminated core type heat sink of the third aspect, the plurality of first plates 4a having an identical planar shape is piled up to form the second plate 4b, and, therefore, no separate plate is necessary as the second plate 4b to suppress the production cost.

As fourth aspect of the invention, by forming integrally a frame part 13 around a periphery of the longitudinal rib and transverse rib of each plate and performing lamination via the frame part 13 thereof, a casing part of the heat sink can be formed.

Meanwhile, each of laminated core type heat sinks having a configuration in which a casing is fit onto a core as in fifth to seventh aspects also exerts the effects of the first to third aspects.

DETAILED DESCRIPTION OF THE INVENTION

Next, embodiments of the present invention will be explained on the basis of the drawings.

Figure 11:
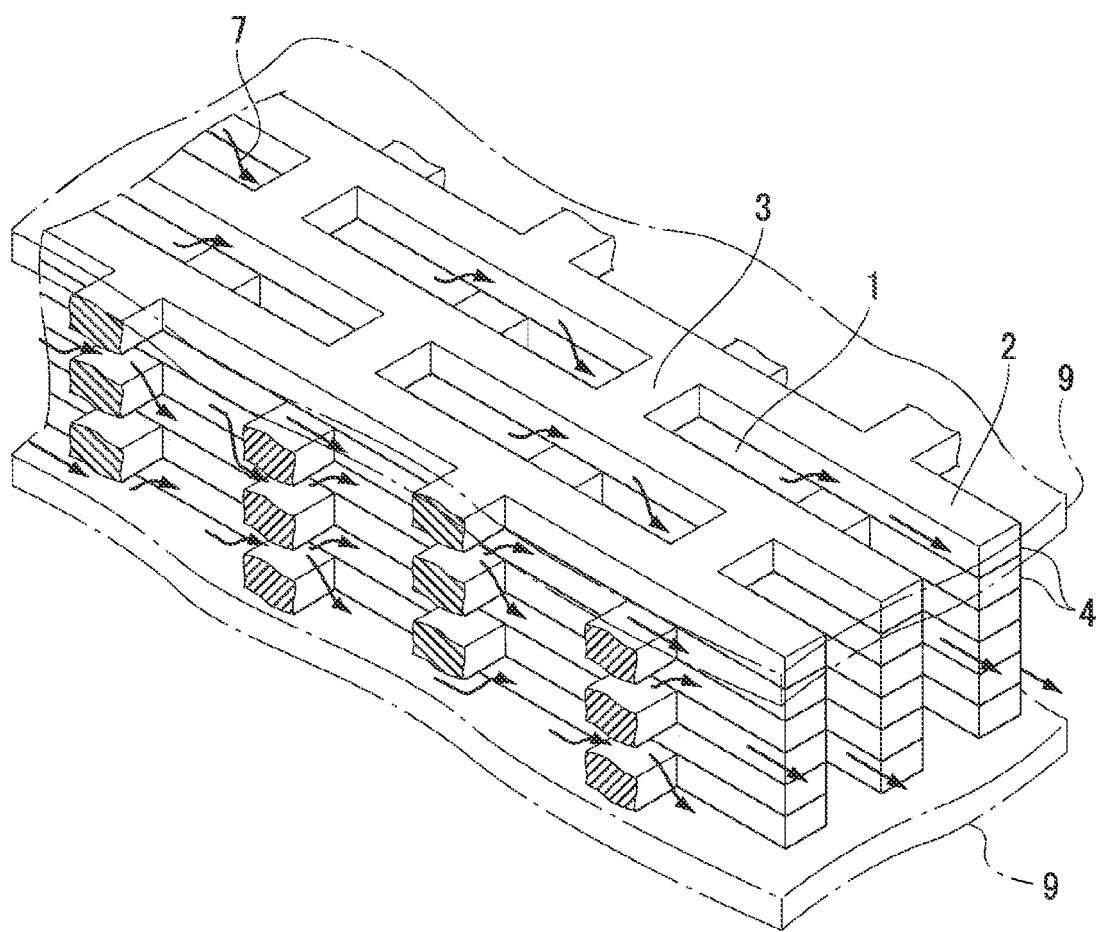
FIG. 11 illustrates an explanatory view of a conventional type heat sink.

The structure of each plate in the core portion of the heat sink of the present invention is the same as that in FIG. 11 illustrating a conventional type heat sink, except for the thickness thereof. That is, a plurality of slits 1 in parallel to each other is punched out in a metal flat plate, and, between these, a plurality of longitudinal ribs 2 in parallel to each other and transverse ribs 3 linking the longitudinal ribs 2 adjacent to each other are arranged.

Meanwhile, the transverse ribs 3 of plates adjacent to each other are shifted in a circulation direction of a refrigerant. Then, the core part, in which respective plates are laminated while the longitudinal ribs 2 of respective plates are matched with each other and positions of the transverse ribs 3 are shifted from each other, is included, and respective plates are brazed and joined. Further, with respect to the longitudinal rib 2 and transverse rib 3 of these respective plates 4, a frame part 13 is formed integrally via a manifold part 5 on the outer side of a portion in which the core part is formed, and, by laminating these frame parts 13 in the thickness direction, the casing part of the heat sink is formed.

Then, to both ends in the lamination direction of respective plates, a pair of end lids 9 are arranged. In addition, in this example, inlet/output pipes 8 are attached to one of the end lids 9, which are communicated with the manifold 5 of each plate. Then, in the example, objects 6a to 6f to be cooled are stuck to the surface of the end lid 9 on the upper end side via an insulating film not illustrated. As an example, the object to be cooled is a semiconductor element such as an inverter. The output thereof is frequently different mutually. Then, via one of the inlet/outlet pipes 8 and manifolds 5, a refrigerant 7 is circulated in a meandering shape in a width direction of the core. Then, heat generated from each of the objects 6a to 6f to be cooled is absorbed via the refrigerant.

EXAMPLE 1

Here, the characteristic of the present invention lies in the core portion in which plates are laminated.

Figure 2:
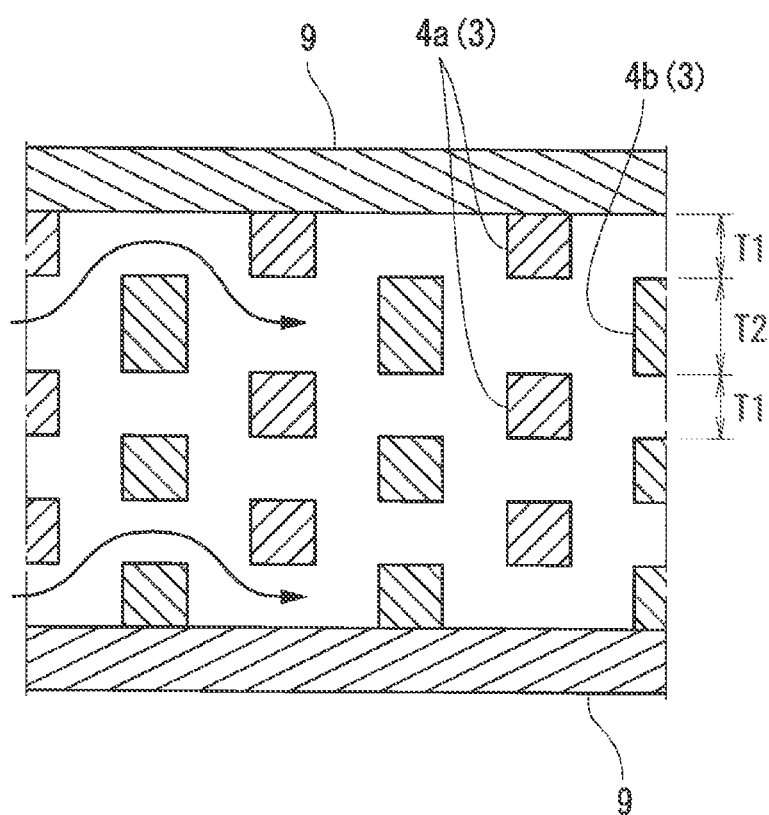
FIG. 2 illustrates a vertical cross-section explanatory view of the same in a circulation direction of a refrigerant, and illustrates a cross-section explanatory view along II-II line in FIG. 1.

The core includes a laminated body of a plurality of first plates 4a having identical thickness, a second plate 4b that is arranged on the second in FIG. 2 and has different thickness, and the end lid 9. The thickness T1 of all the first plates 4a is identical, and the thickness T2 of the second plate 4b arranged on the second from the end lid 9 is greater than T1. That is, T2>T1 is established.

Figure 5:
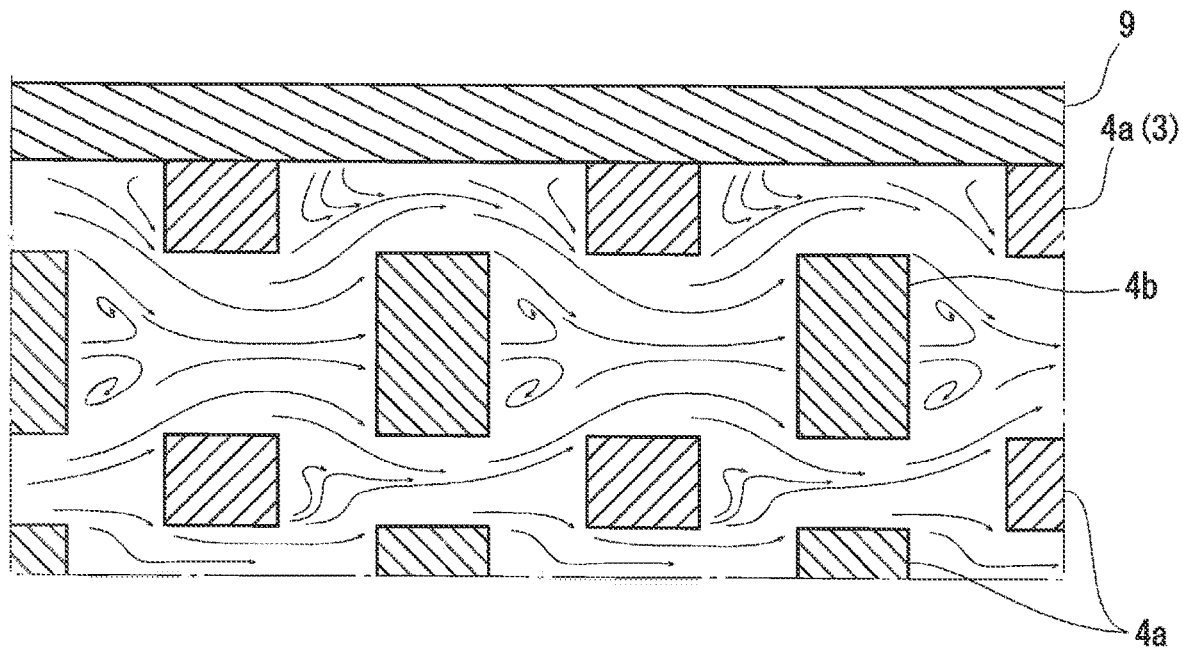
FIG. 5 illustrates an explanatory view showing a state of flow in the laminated core type heat sink in first Example of the present invention.

The flow of a refrigerant at this time is illustrated in FIG. 5.

Figure 6:
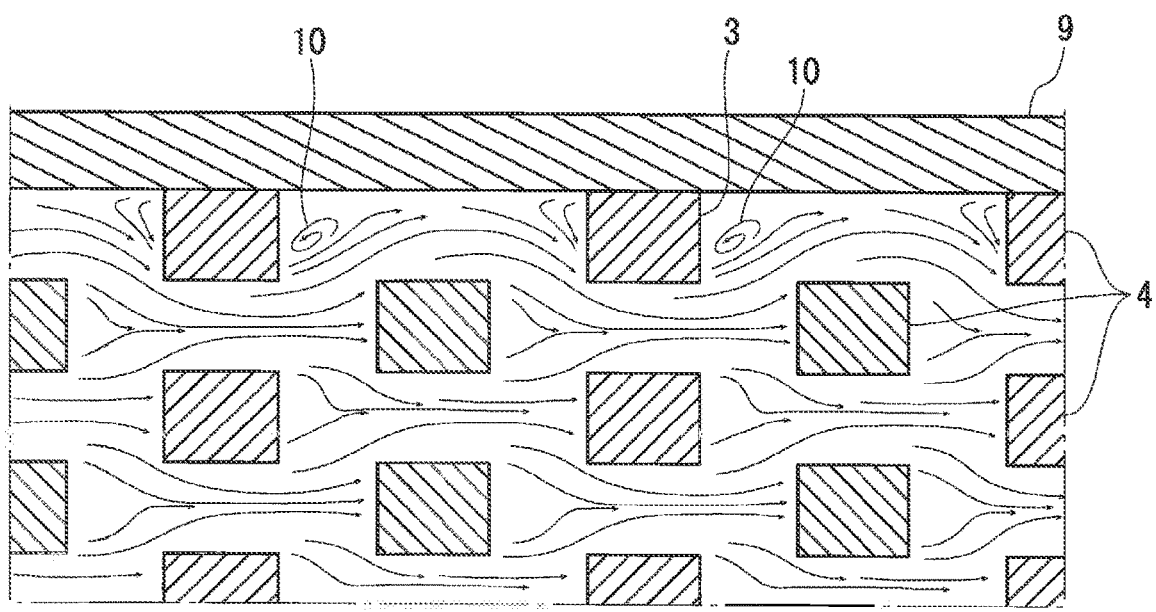
FIG. 6 illustrates an explanatory view showing a state of flow in a conventional type heat sink.

Regarding the flow in FIG. 5, as compared with a conventional type in FIG. 6, a backwater is absent on the downstream side of the first plate 4a that contacts to the end lid 9 and has the highest heat release effect in the flow direction of a refrigerant. It is presumed that this is based on the correlation between thicknesses of the first plate 4a and second plate 4b.

Figure 7:
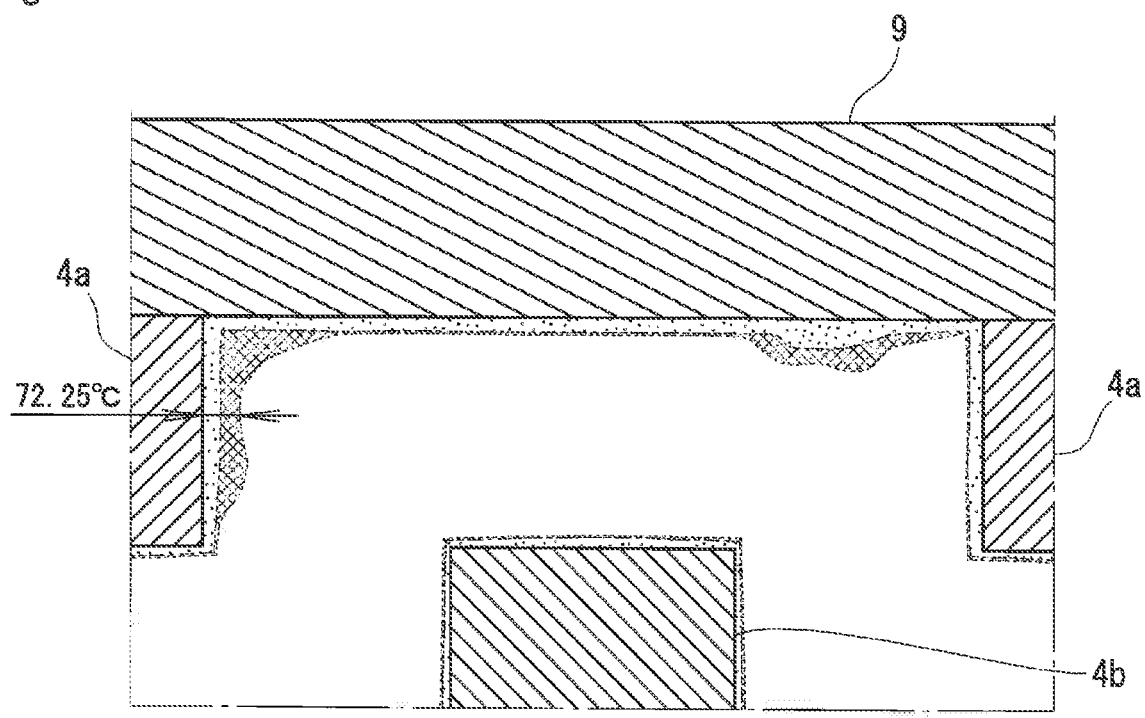
FIG. 7 illustrates an explanatory view showing temperature distribution in the laminated core type heat sink of the present invention.
Figure 8:
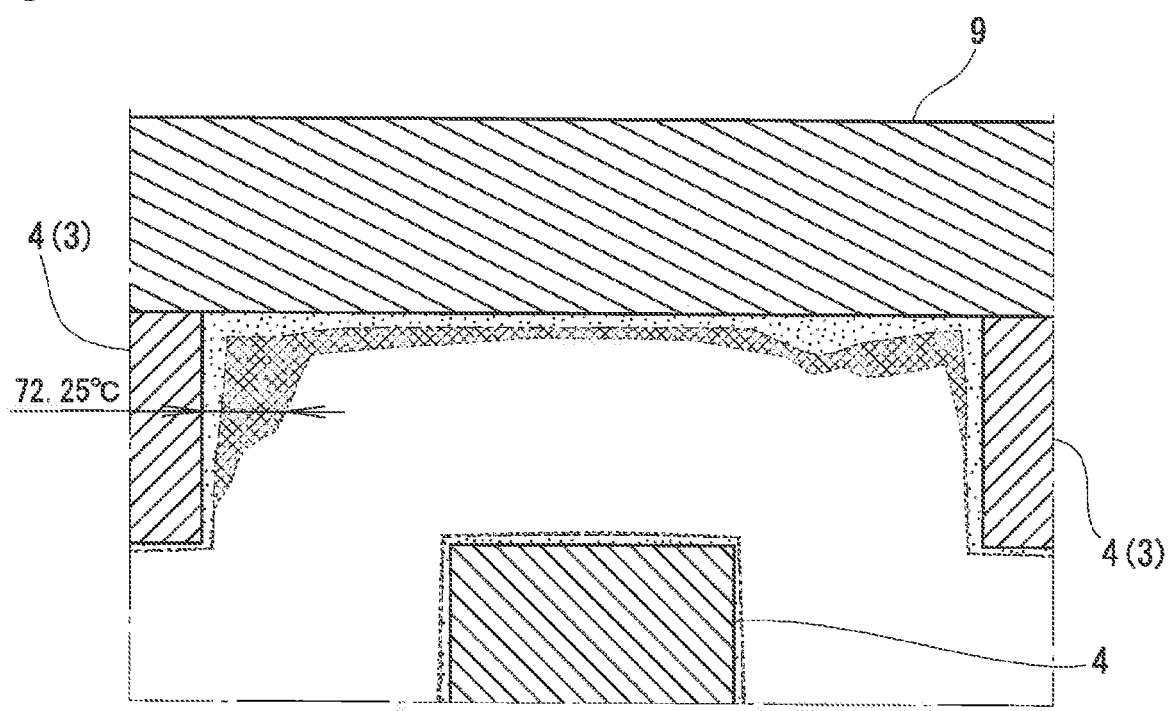
FIG. 8 illustrates an explanatory view showing temperature distribution in a conventional type laminated core type heat sink.

On the basis of it, from FIG. 7, it is shown that a high temperature region of a refrigerant generated on the downstream side of the first plate 4a decreases in the width as compared with the high temperature region of the conventional type heat sink in FIG. 8. In other words, it is known that, in FIG. 7, thickness of a refrigerant having temperature not less than 72.25° C. on the downstream side of the first plate 4a is remarkably narrow as compared with the width thereof in FIG. 8 illustrating a conventional type.

Meanwhile, also in the example, water is used as a refrigerant and water temperature at an inflow port is 65° C. A flow rate was set to 10 L/min, an object to be cooled was stuck on the end lid 9, which was caused to generate heat of 300 W, and temperature distribution near the surface of the first plate 4a contacting to the end lid 9 was checked. Consequently, in the drawing, the cross-section portion of the refrigerant abutting the surface of the first plate 4a, shown by dots, is at not less than 74° C., and the cross-section portion shown by cross-hatching is at 72.25° C. to 74° C.

The ratio T2/T1 at this time is 2.0.

Figure 1:
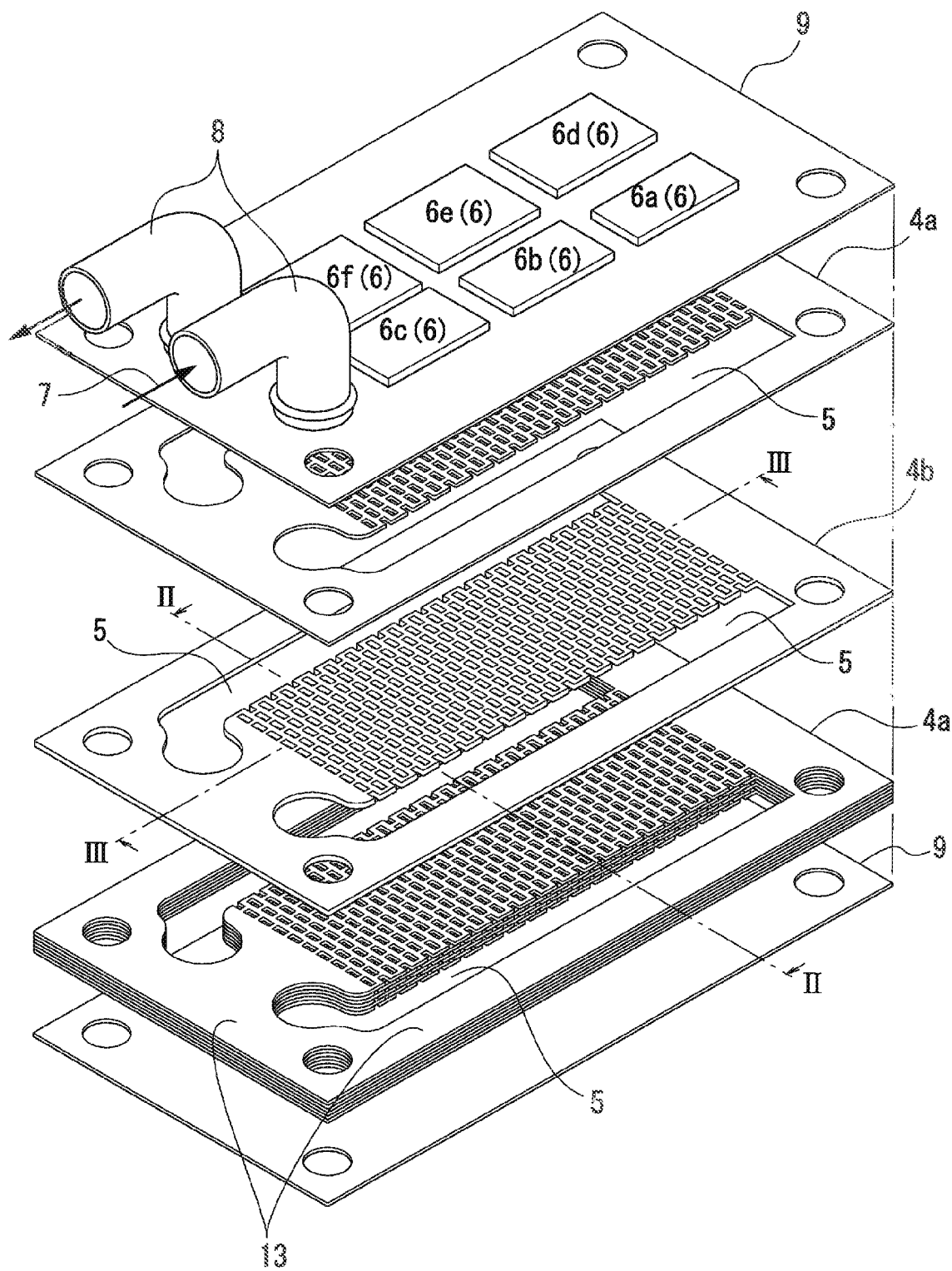
FIG. 1 illustrates an exploded perspective view of a laminated core type heat sink of the present invention.
Figure 9:
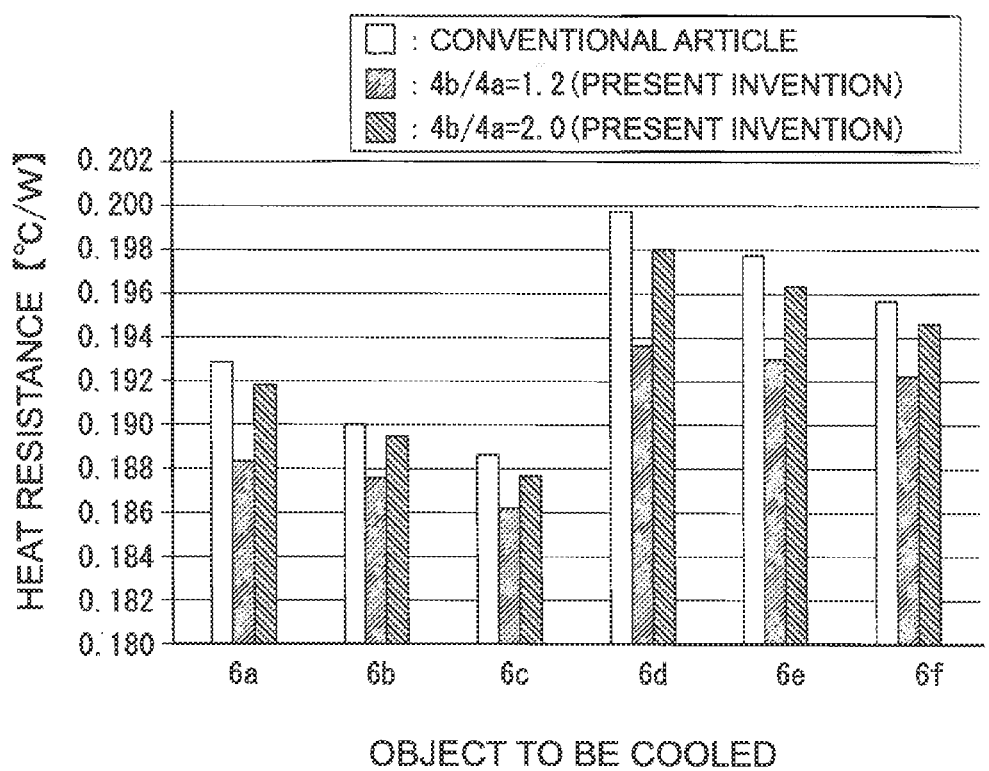
FIG. 9 illustrates a comparison of heat resistance between a conventional type heat sink and the heat sink of the present invention, and illustrates cases of objects 6a to 6f to be cooled in FIG. 1.

Next, FIG. 9 illustrates examples of comparison in which heat resistance of a heat sink of the conventional article and heat resistance of the heat sink of the present invention were compared for the respective objects 6a to 6f to be cooled in FIG. 1 when respective ratios of the second plate 4b/first plate 4a regarding thicknesses thereof were changed. Meanwhile, the heat resistance here is a value expressing difficulty of temperature transmission, and means temperature rise per unit time and per quantity of heat generation, with a unit of ° C./W.

As known from the drawing, in each of the objects 6a to 6f to be cooled, heat resistance is smaller in the heat sink of the present invention than in a conventional article.

In the Example, a plate in which a linear longitudinal rib and transverse rib are linked has been explained. However, the same is applied even to a plate in which a slit and rib have a wave-like shape in a plane (see, for example, Japanese Patent Laid-Open No. 2010-114174).

EXAMPLE 2

Figure 3:
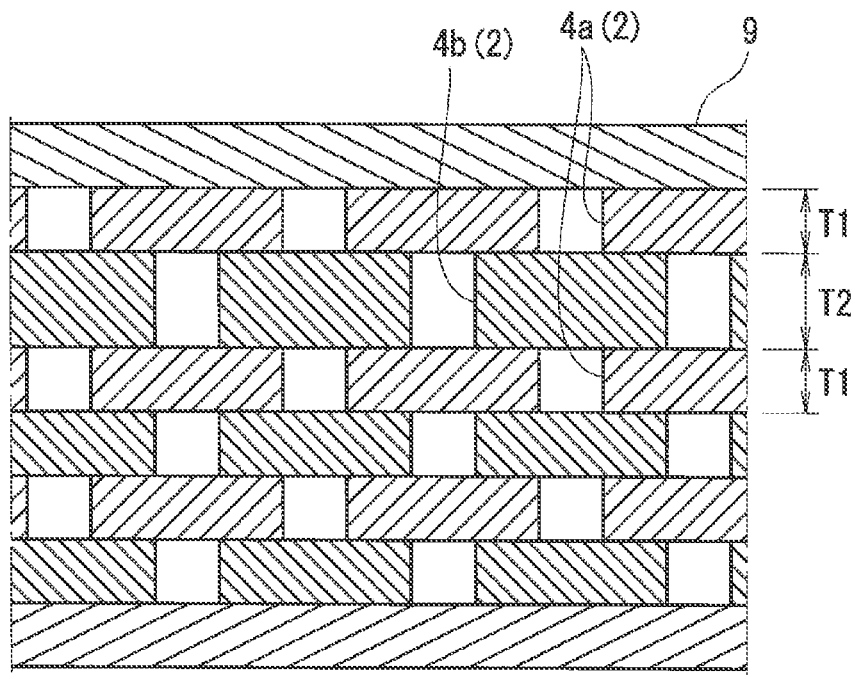
FIG. 3 illustrates an explanatory view showing a laminated state of the heat sink, and illustrates a cross-section explanatory view along III-III line in FIG. 1.
Figure 4:
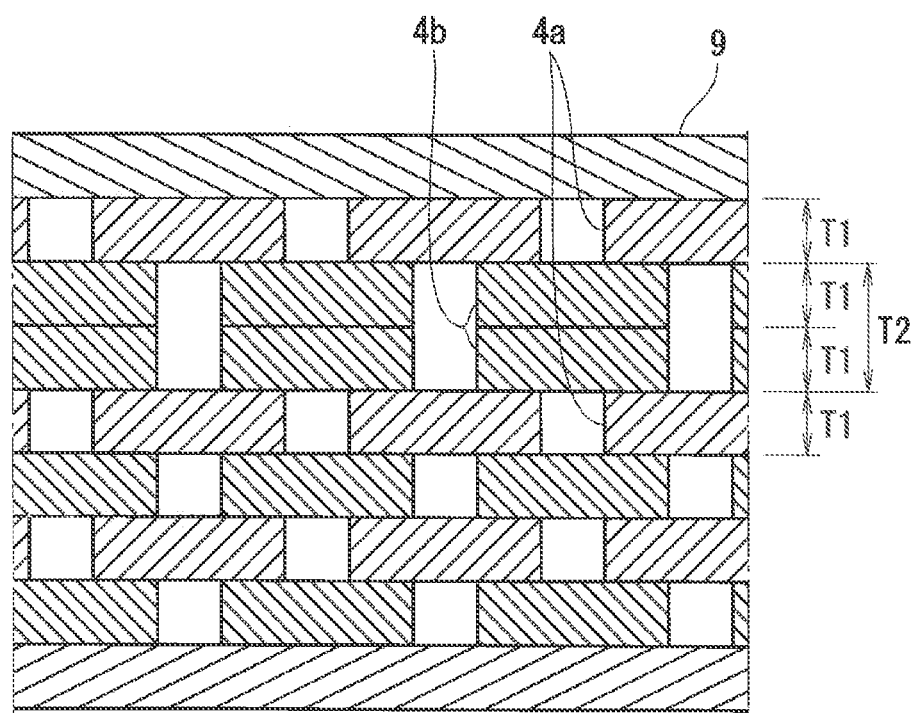
FIG. 4 illustrates a vertical cross-sectional view showing a laminated state of a heat sink that shows another embodiment of the present invention, and illustrates a cross-section explanatory view along III-III line in FIG. 1.

FIG. 4 illustrates another Example of the present invention, in which two first plates 4a having an identical planar shape are piled up to form the second plate 4b. Also in this way, the laminated core type heat sink shown by Example in FIG. 3 can be manufactured. In the Example, a separate plate is unnecessary as the second plate 4b, and, therefore, production cost can be suppressed.

Meanwhile, in the example, cooling water for cooling an engine was cooled with a radiator, which was then used as the refrigerant 7. Further, another liquid can also be used instead of it.

Next, in the example, the object to be cooled is arranged to the end lid 9 on the upper face side in FIG. 1, but it may be arranged to the end lid 9 on the lower face side. Alternatively, an object to be cooled can also be arranged to both end lids. In a case where an object to be cooled is to be arranged to both upper and lower end lids, thickness of plates each arranged on the second from each end lid may be set to greater than that of other plates.

Figure 10:
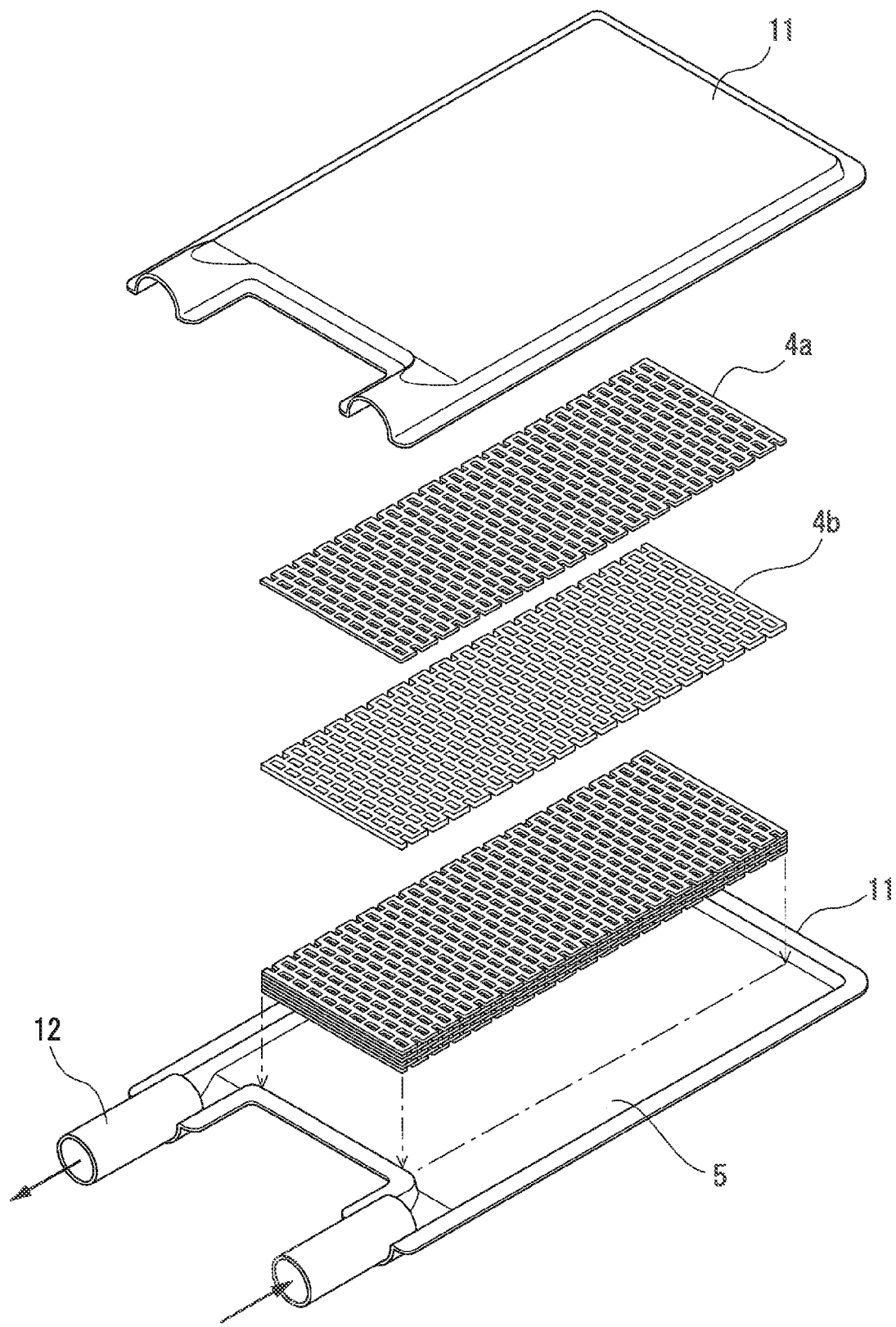
FIG. 10 illustrates an exploded perspective view showing yet another embodiment of the present invention.

Next, FIG. 10 illustrates yet another Example of the present invention. Different points between the Example and the example in FIG. 1 are shapes of the first plate 4a and second plate 4b, and a shape of the end lid 9. In the first plate 4a and second plate 4b in Example in FIG. 10, a manifold does not exist, and instead, the end lid is formed by a pair of dish-like casing 11, in the inside of which the laminated core is interposed and a space for the manifold 5 is formed. Consequently, the width of each of the first plates 4a and the second plate 4b is formed narrowly by the space for the manifold 5.

The present invention can be utilized for a laminated type heat sink that cools a semiconductor such as an inverter with a refrigerant.

The invention claimed is:

1. A heat sink, comprising:
   a laminated core comprising a plurality of discrete flat metal plates in a laminated configuration, each of the plates having a plurality of mutually parallel slits formed therethrough to define a plurality of mutually parallel longitudinal ribs and a plurality of mutually parallel transverse ribs, the transverse ribs linking respective adjacent ones of the longitudinal ribs, the longitudinal ribs and the transverse ribs forming the perimeters of the slits, and
   a pair of lids each of which is laminated to a respective end one of the plates of the laminated core;
   wherein the longitudinal ribs of each of the plates is in registry with the longitudinal ribs of all the others of the plates,
   wherein the transverse ribs of some of the plates are offset from the transverse ribs of others of the plates,
   wherein an exterior surface of at least one of the lids is configured to receive an object to be cooled,
   wherein the laminated core is configured to circulate refrigerant in a longitudinal direction of the longitudinal ribs and into the slits,
   wherein a first one of the plates abutting the lid having the exterior surface configured to receive the object to be cooled and a plurality of mutually adjacent ones of the plates next after a second of the plates in a direction of the lamination are of a same thickness, and
   wherein the second plate is one of the discrete plates or is a plurality of the discrete plates laminated to one another in registry with one another, and the second plate is of greater thickness in the direction of lamination than the first plate and the plurality of mutually adjacent plates next after the second plate in the direction of lamination.

2. The heat sink according to claim 1, wherein (thickness T2 of the second plate)/(thickness T1 of the first plate) is ≥1.2.

3. The heat sink according to claim 1, wherein the second plate is a plurality of the discrete plates.

4. The heat sink according to claim 1, wherein the second plate is one of the discrete plates.

5. The heat sink according to claim 1, wherein each of the plates is framed by a respective frame which is integral with the plate and a manifold for circulating the refrigerant to and from the plates is integrally formed in opposed longitudinal sides of the frames, the manifold extending longitudinally parallel to the longitudinal ribs.

6. A heat sink, comprising:
   a laminated core comprising a plurality of discrete flat metal plates in a laminated configuration, each of the plates having a plurality of mutually parallel slits formed therethrough to define a plurality of mutually parallel longitudinal ribs and a plurality of mutually parallel transverse ribs, the transverse ribs linking respective adjacent ones of the longitudinal ribs, the longitudinal ribs and the transverse ribs forming the perimeters of the slits, and a pair of lids, at least one of the lids being concave, configured as a casing for the laminated core with the lids abutting faces of respective end ones of the plates; and a manifold formed in the casing, the manifold having respective parts running in a longitudinal direction parallel to the longitudinal ribs at respective longitudinal sides of the plates and being configured to circulate refrigerant to and from the laminated core;

wherein the longitudinal ribs of each of the plates is in registry with the longitudinal ribs of all the other of the ribs, wherein the transverse ribs of some of the plates are offset from the transverse ribs of other of the plates, wherein an exterior surface of at least one of the lids is configured to receive an object to be cooled, wherein the laminated core is configured to circulate refrigerant in a longitudinal direction of the longitudinal ribs and into the slits, wherein a first one of the plates abutting the lid having the exterior surface configured to receive the object to be cooled and a plurality of mutually adjacent ones of the plates next after a second of the plates in a direction of the lamination are of a same thickness, and wherein the second plate is one of the discrete plates or is a plurality of the discrete plates laminated to one another in registry with one another, and the second plate is of greater thickness in the direction of lamination than the first plate and the plurality of mutually adjacent plates next after the second plate in the direction of lamination.

7. The heat sink according to claim 6, wherein (thickness T2 of the second plate)/(thickness T1 of the first plate) is ≥1.2.

8. The heat sink according to claim 6, wherein the second plate is a plurality of the discrete plates.

9. The heat sink according to claim 6, wherein the second plate is one of the discrete plates.

* * * * *